United States Patent [19]

Huang

[11] Patent Number: 4,908,528

[45] Date of Patent: Mar. 13, 1990

[54] INPUT CIRCUIT HAVING IMPROVED NOISE IMMUNITY

[75] Inventor: Eddy Huang, San Jose, Calif.

[73] Assignee: VLSI Technology, Inc., San Jose, Calif.

[21] Appl. No.: 222,567

[22] Filed: Jul. 21, 1988

[51] Int. Cl.[4] .................. H03K 17/16; H03B 1/04
[52] U.S. Cl. ............................ 307/443; 307/448; 307/451; 307/542; 307/546; 307/548
[58] Field of Search ............... 307/443, 448, 451, 542, 307/543, 546, 548

[56] References Cited

U.S. PATENT DOCUMENTS 4,211,942  7/1980  Aoki et al. ............... 307/358
4,758,749  7/1988  Rapp ........................ 307/451
4,763,023  8/1988  Spence ..................... 307/451

Primary Examiner—Stanley D. Miller
Assistant Examiner—Margaret Rose Wambach
Attorney, Agent, or Firm—Limbach, Limbach & Sutton

[57] ABSTRACT

An improved CMOS input circuit is disclosed. A conventional CMOS input circuit having a plurality of inverter stages is used. The improvement comprises a N-type MOS transistor with the source connected to ground potential and the drain connected to the output node of one of the inverters. A capacitor couples a ground transient to the gate of the first N-type MOS transistor. An N-type MOS transistor provides AC isolation between the input node and the gate of the first N-type MOS transistor. A similar structure is shown for a P-type transistor connected to the power source.

10 Claims, 3 Drawing Sheets

INPUT CIRCUIT HAVING IMPROVED NOISE IMMUNITY

TECHNICAL FIELD

The present invention relates to the field of input circuits and, more particularly, to input circuits of the type using Complementary Metal Oxide Silicon (CMOS) transistors.

BACKGROUND OF THE INVENTION

Input circuits using CMOS transistors are well-known in the art. Typically, they comprise a plurality of inverters, using CMOS transistors, connected in series. An input signal is supplied to the input of a first inverter. The output signal of the first inverter is supplied as the input signal to a second inverter. The output signal of the second inverter is supplied as the input signal of a third inverter and so forth. The output signal from the input circuit is supplied to an electronic circuit performing a desired function. The plurality of serially connected inverters provides for a buffer or acts to reduce noise signals from being introduced into the electronic circuit. Thus, with a plurality of inverters separating the input signal from the electronic circuit, the electronic circuit is immune to noise and the like. Examples of input circuits from the prior art can be found in U.S. Pat. Nos. 4,210,829; 4,296,340; 3,774,053 and 3,603,813.

Though CMOS circuits inherently consume less power than NMOS or Bipolar circuits, a large transient current occurs when the CMOS circuits are switching states. The magnitude of this switch noise becomes a problem as more advanced CMOS processes allow even faster switching speed and more circuits are integrated into one chip, with many large output buffers switching simultaneously. The large transient current will perturb the on-chip power and ground levels. This perturbation may cause the CMOS input circuit to switch erroneously or to slow down dramatically.

SUMMARY OF THE INVENTION

In the present invention, an improved electronic integrated input circuit is disclosed. The input circuit is of the type having a plurality of inverters with each inverter having a MOS transistor of the P type and a MOS transistor of the N type. The gate of the P-type transistor is connected to an input node, its drain is connected to a positive voltage source and its source is connected to the drain of the N-type MOS transistor and to an output node, with the output node being the output of the inverter. The gate of the N-type MOS transistors is connected to the input node and the source of the N-type MOS transistors is connected to a ground potential. In the improvement of the present invention, a first MOS transistor of the N type has a source, a drain and a gate, with the source connected to the ground potential and the drain connected to the output node of the inverter. A first means couples a ground transient to the gate of the first MOS transistor. A first pass transistor means provides AC isolation between the input node and the gate of the first MOS transistor means.

DETAILED DESCRIPTION OF THE DRAWINGS

Figure 1:
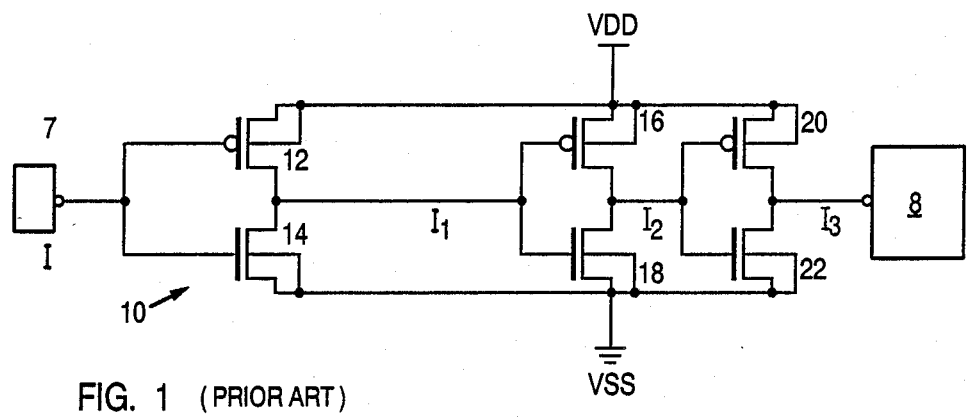
FIG. 1 is a schematic circuit diagram of a CMOS input circuit of the prior art.

Referring to FIG. 1, there is shown a schematic circuit diagram of a Complementary Metal Oxide Silicon (CMOS) input circuit 10 of the prior art. The input circuit 10 receives an input signal I and provides an output signal $I_3$. The output signal $I_3$ is supplied to an electronic circuit 8 performing a desired function. The CMOS input circuit 10 acts as a buffer between the input signal I and the electronic circuit 8. Further, the CMOS circuit 10 provides power and ground noise immunity to the electronic circuit 8. Typically, the input circuit 10 and the electronic circuit 8 are all manufactured on a single integrated circuit chip. In that event, the input signal I is supplied to the input pad 7 of the integrated circuit chip.

The input circuit 10 comprises a plurality of inverters. Three inverters are shown in FIG. 1. The first inverter comprises transistors 12 and 14. The second inverter comprises transistors 16 and 18. The third inverter comprises transistors 20 and 22. The first, second and third inverters are all connected in series. Thus, the input signal I is supplied to the first inverter producing an output signal $I_1$. The signal $I_1$ is supplied as the input signal to the second inverter providing the output signal $I_2$. The signal $I_2$ is supplied as the input signal to the third inverter and the output signal $I_3$ is supplied as the input signal to the electronic circuit 8.

Each of the inverters comprises a P-type MOS transistor and an N-type MOS transistor. The P-type MOS transistor and the N-type MOS transistors are connected as shown in FIG. 1 to form an inverter and is well-known in the art.

Figure 2:
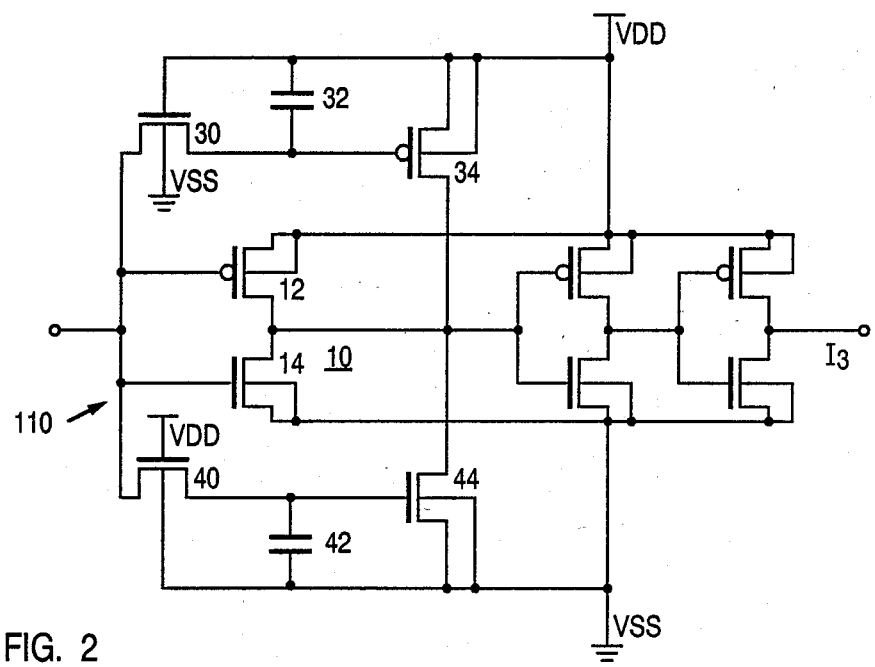
FIG. 2 is a schematic circuit diagram of one embodiment of an improved CMOS input circuit of the present invention.

Referring to FIG. 2, there is shown a schematic circuit diagram of one embodiment of an improved CMOS input circuit 110 of the present invention. The improved CMOS input circuit 110 comprises the input circuit 10 of the prior art and a first transistor 40 of the N type, a second transistor 44 of the N type, a third transistor 30 of the N type, a fourth transistor 34 of the P type, a first capacitor 42, and a second capacitor 32.

The second transistor 44 has a source, a drain, a body and a gate with the source and the body connected to the ground potential $V_{ss}$, and the drain connected to the output node of the first stage inverter of the CMOS input circuit 10 to receive the output signal $I_1$. The first capacitor 42 is connected between the gate of the second transistor 44 and the ground potential $V_{ss}$. The first transistor 40 has a source, a drain, a gate and a boy. The body of the first transistor 40 is connected to the ground potential. The gate of the first transistor 40 is connected to $V_{dd}$. The source of the first transistor 40 is connected to the gate of the second transistor 44. The drain of the first transistor 40 is connected to the input node of the CMOS input circuit 10 to receive the input signal I.

The fourth transistor 34 has a source, a drain, a gate and a body. The drain and the body are connected to the voltage source $V_{dd}$. The source is connected to the output node of the first stage inverter of the CMOS input circuit 10 for receiving the signal $I_1$. The second capacitor 32 connects the gate of the fourth transistor 34 to the voltage source $V_{dd}$. The third transistor 30 also has a drain, a source, a gate and a body. The body of the third transistor 30 is connected to ground potential $V_{ss}$. The gate of the third transistor 30 is connected to the voltage source $V_{dd}$. The source of the third transistor 30 is connected to the input node to receive the signal I. The drain of the third transistor 30 is connected to the gate of the fourth transistor 34.

In the operation of the improved CMOS input circuit 10 of the present invention, the first capacitor 42 is used to couple ground transients to the gate of the second transistor 44. Further, there is coupling between the gate of the second transistor 44 through the source/body of the second transistor 44. The first transistor 40 is a pass transistor which provides AC isolation between the input signal I and the gate of the second transistor 44. For an input signal I that is at high level, that signal is passed through the first transistor 40 and is supplied to the gate of the second transistor 44. The gate of the second transistor 44 is then charged high. A positive-going ground transient in the input signal I will be coupled into the gate of the second transistor 44. This, in turn, will turn on the second transistor 44 harder to clamp the output signal $I_1$ to ground.

Similarly, the second capacitor 32 is used to couple power transients to the gate of the fourth transistor 34. Further, there is capacitive coupling between the drain/substrate of the fourth transistor 34 through its gate. The third transistor 30, similar to the first transistor 40, is a pass transistor which provides AC isolation between the input signal I and the gate of the fourth transistor 34. For an input signal I which is at ground level, this is passed through the third transistor 30, to the gate of the fourth transistor 34, which will be at ground. When a negative-going power transient in &:he input signal I is supplied to the CMOS input circuit 110 of the present invention, it will also be coupled to the gate of the fourth transistor 34. The fourth transistor 34 will be turned on harder to clamp the output signal $I_1$ to power level of $V_{dd}$.

All of the transistors 40, 44, 30 and 34 used in the improved CMOS input circuit 110 of the present invention can be enhancement or depletion devices.

Figure 3:
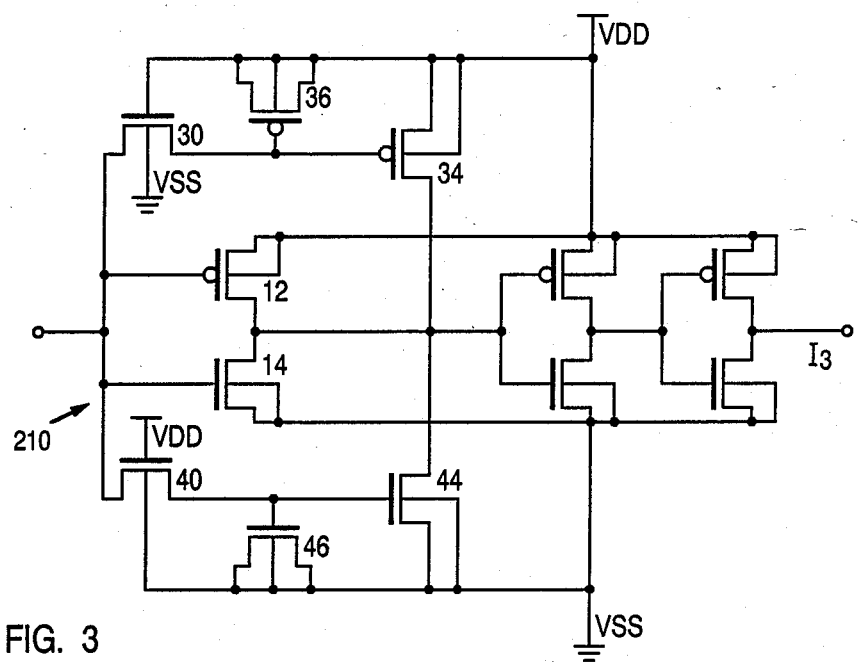
FIG. 3 is a schematic circuit diagram of another embodiment of an improved CMOS input circuit of the present invention.

Referring to FIG. 3, there is shown another embodiment of an improved CMOS input circuit 210 of the present invention. The improved CMOS input circuit 210 of the present invention differs from the improved CMOS circuit 110 of the present invention only in that a fifth transistor 46 has replaced the first capacitor 42 and a sixth transistor 36 has replaced the second capacitor 32. The fifth transistor 46 is of an N-channel type. The sixth transistor 36 is of a P-channel type. The fifth transistor 46 has a gate, a source, a drain and a body. The gate of the sixth transistor 36 is connected to the gate of the fourth transistor 34. The drain, the source and the body of the sixth transistor 36 are all tied together and are connected to the power source $V_{dd}$. The fifth transistor 46 also has a gate which is connected to the gate of the second transistor 44. The source, the drain and the body of the fifth transistor 46 are all connected together and is connected to the ground potential $V_{ss}$.

The fifth and sixth transistors 46 and 36 are all enhancement-type transistors which act as coupling capacitors and function in the same way as the first and second capacitors 32 and 42.

Figure 4:
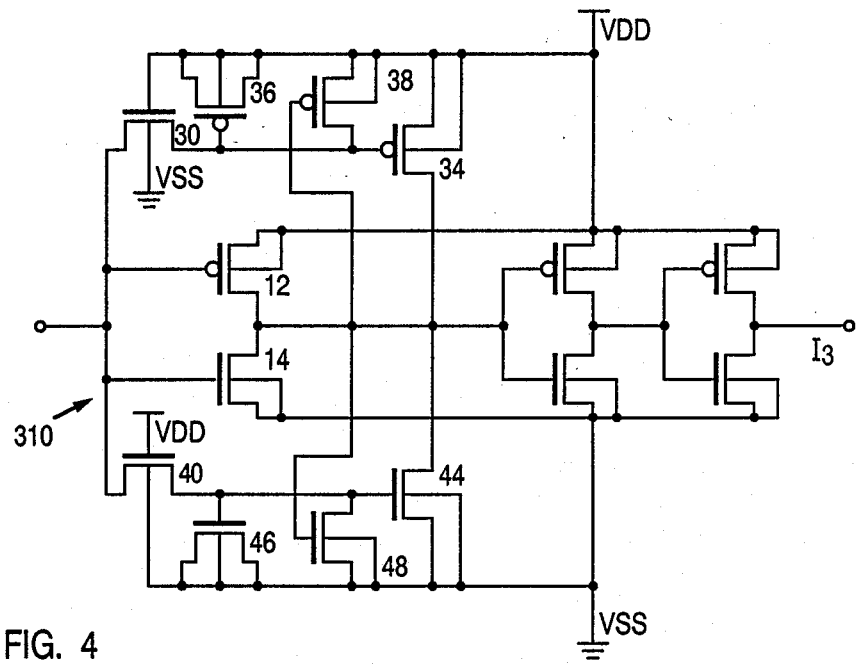
FIG. 4 is a schematic circuit diagram of yet another embodiment of an improved CMOS input circuit of the present invention.

Referring to FIG. 4, there is shown yet another embodiment of an improved CMOS input circuit 310 of the present invention. The improved input circuit 310 is identical to the improved input circuit 210 shown in FIG. 3, except with the addition of the seventh transistor 48, the eighth transistor 38 and modification of the third transistor 30.

The third transistor 30 in FIG. 4 has been modified slightly to have its gate tied to the output of the first inverter. This is to provide faster switching. When the input is at low, the output rises close to a high level, the output of the first inverter will start to go low, which will start turning the transistor 30 off. With transistor 30 being turned off to isolate the input from the gate of transistor 34, output of the first inverter will go low faster as the pull up transistor 34 is being turned off quickly.

The eighth transistor 38 is of a P-channel type. The gate of the eighth transistor 38 is connected to the output node $I_1$ of the input circuit 10. The source of the eighth transistor 38 is connected to the gate of the fourth transistor 34. The drain and body of the seventh transistor 38 are connected to the power source $V_{dd}$.

The seventh transistor 48 is of the N-channel type. The gate of the seventh transistor 48 is connected to the output $I_1$ of the input circuit 10. The source and the body of the seventh transistor 48 are connected together and is connected to ground potential $V_{ss}$. The drain of the seventh transistor 48 is connected to the gate of the fourth transistor 44.

In the embodiment shown in FIG. 4, the improved input circuit 310 has hysteresis. Hysteresis is accomplished by imposing different trip points for the first stage inverter when input is going from low-to-high and high-to-low. When input is going from low to high, two p channel transistors 12 and 34 and one n channel transistor 14 are active to determine the trip point. Once the input reaches high level, output of the first stage inverter becomes low which turns the p channel transistor 34 off and n channel transistor 44 on. Thus, when input is going from high to low, one p channel transistor 12 and two n channel transistor 14 and 44 will determine the trip point, which is lower than that for the case when input is going from low to high.

Figure 5:
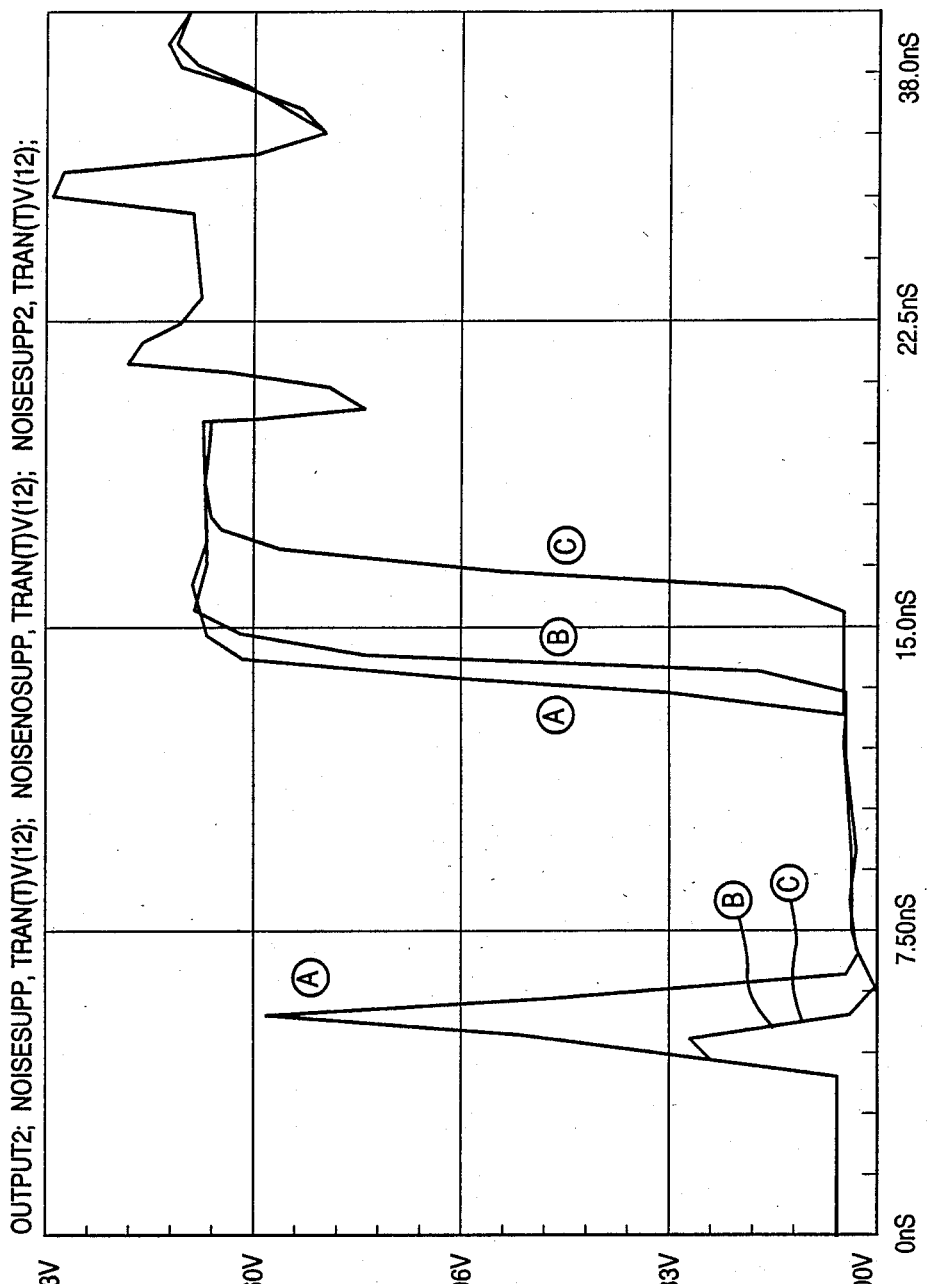
FIG. 5 is a graph showing the output signal from the CMOS input circuits of FIGS. 1, 3 and 4.

Referring to FIG. 5, there is shown the simulation output waveforms at $I_3$ of the input CMOS circuit 10, 210 and 310. The waveforms designated A, B and C are for those circuits, respectively. As can be seen in FIG. 5, there is improvement in noise immunity with the circuits 210 and 310, as compared to the prior art input circuit 10. However, although the improved input circuit 310 shows a greater noise immunity, slight speed degradation is also shown.

What is claimed is:

1. In an improved electronic integrated input circuit of the type having Complementary Metal Oxide Silicon (CMOS) transistors forming an input circuit, said input circuit having a plurality of inverters with each inverter having an MOS transistor of the P type and an MOS transistor of the N type, with the gate of the P-type transistor connected to an input node, its drain connected to a positive voltage source, its source connected to the drain of the N-type MOS transistor and to an output node, with the output node being the output of said inverter, the gate of the N-type MOS transistor being connected to the input node and the source of said N-type MOS transistor being connected to a ground potential; wherein said improvement comprising:

a first MOS transistor means of the N type having a source, a drain, and a gate with the source connected to said ground potential, and the drain connected to the output node of said inverter;

first means for capacitively coupling a ground transient to the gate of said first MOS transistor; and first pass transistor means for providing AC isolation between said input node and the gate of said first MOS transistor means.

2. The circuit of claim 1 further comprising:

a second MOS transistor means of the P type having a source, a drain, and a gate with the drain connected to said voltage source, and the source connected to the output node of said inverter;

second means for coupling a voltage transient to the gate of said second MOS transistor; and second pass transistor for providing AC isolation between said input node and the gate of the said second MOS transistor means.

3. The circuit of claim 1 wherein said first coupling means comprises a capacitor connected between the gate of said first MOS transistor means and said ground potential.

4. The circuit of claim 1 wherein said first coupling means comprises a third MOS transistor of the N type having a gate connected to the gate of said first MOS transistor, a drain and a source, both connected to said ground potential.

5. The circuit of claim 2 wherein said second coupling means comprises a capacitor connected between the gate of said second MOS transistor means and said voltage source.

6. The circuit of claim 2 wherein said second coupling means comprises a fourth MOS transistor of the P type having a gate connected to the gate of said second MOS transistor, a drain and a source, both connected to said voltage source.

7. The circuit of claim 1 wherein said first pass transistor means is a first pass transistor of the N type having a gate connected to said positive voltage source, a source connected to said input node, a drain connected to the gate of said first MOS transistor means.

8. The circuit of claim 2 wherein said second pass transistor means is a second pass transistor of the N type having a gate connected to said positive voltage source, a source connected to said input node, a drain connected to the gate of said second MOS transistor means.

9. The circuit of claim 4 further comprising:

a fifth MOS transistor of the N type having a gate connected to the output node of said inverter, a source connected to said ground potential and a drain connected to the gate of said first MOS transistor means.

10. The circuit of claim 5 further comprising:

a sixth MOS transistor of the P type having a gate connected to the output node of said inverter, a drain connected to said voltage source and a source connected to the gate of said second MOS transistor means.

* * * * *